US009960159B2

(12) United States Patent
Veliadis

(10) Patent No.: US 9,960,159 B2
(45) Date of Patent: May 1, 2018

(54) MONOLITHIC BI-DIRECTIONAL CURRENT CONDUCTING DEVICE AND METHOD OF MAKING THE SAME

(71) Applicant: John V. Veliadis, Hanover, MD (US)

(72) Inventor: John V. Veliadis, Hanover, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 46 days.

(21) Appl. No.: 15/015,564

(22) Filed: Feb. 4, 2016

(65) Prior Publication Data

US 2016/0155738 A1 Jun. 2, 2016

Related U.S. Application Data

(63) Continuation of application No. 14/483,851, filed on Sep. 11, 2014, now Pat. No. 9,293,465.

(51) Int. Cl.
| | |
|---|---|
| *H01L 27/088* | (2006.01) |
| *G06F 9/44* | (2018.01) |
| *H01L 21/8234* | (2006.01) |
| *H01L 29/06* | (2006.01) |
| *H01L 29/66* | (2006.01) |
| *H01L 29/808* | (2006.01) |

(52) U.S. Cl.
CPC .............. *H01L 27/088* (2013.01); *G06F 8/33* (2013.01); *G06F 8/75* (2013.01); *H01L 21/823418* (2013.01); *H01L 21/823487* (2013.01); *H01L 29/0619* (2013.01); *H01L 29/66909* (2013.01); *H01L 29/8083* (2013.01); *G06F 8/72* (2013.01)

(58) Field of Classification Search
None
See application file for complete search history.

(56) References Cited

U.S. PATENT DOCUMENTS

| 5,945,701 | A | * | 8/1999 | Siergiej | ............... H01L 29/7722 257/263 |
| 5,949,124 | A | * | 9/1999 | Hadizad | ............... H01L 23/585 257/487 |
| 8,130,023 | B2 | | 3/2012 | Veliadis | |
| 8,673,703 | B2 | | 3/2014 | Lin et al. | |
| 9,054,021 | B2 | | 6/2015 | Xiao et al. | |
| 9,293,465 | B1 | * | 3/2016 | Veliadis | ............... H01L 27/098 |
| 2003/0162355 | A1 | * | 8/2003 | Sankin | ............... H01L 29/0619 438/268 |
| 2006/0043474 | A1 | * | 3/2006 | Kinzer | ............... H01L 29/781 257/330 |

(Continued)

FOREIGN PATENT DOCUMENTS

| WO | WO 99/33118 A1 | 7/1999 |
| WO | WO 2013/052054 A1 | 4/2013 |

*Primary Examiner* — Angel Roman
*Assistant Examiner* — Kevin Quinto
(74) *Attorney, Agent, or Firm* — Tarolli, Sundheim, Covell & Tummino LLP

(57) ABSTRACT

A monolithic bi-directional device provides bi-directional power flow and bi-directional blocking of high-voltages. The device includes a first transistor having a first drain formed over a first channel layer that overlays a substrate, and a second transistor that includes a second drain formed over a second channel layer that overlays the substrate. The substrate forms a common source for both the first transistor and the second transistor.

10 Claims, 9 Drawing Sheets

(56) References Cited

U.S. PATENT DOCUMENTS

2006/0157813 A1* 7/2006 Saito .................. H01L 29/0634
                                                         257/498
2009/0317916 A1    12/2009 Ewing et al.
2010/0096546 A1     4/2010 Ewing et al.
2011/0027905 A1     2/2011 Henderson et al.
2013/0313524 A1    11/2013 De Micheli et al.

* cited by examiner

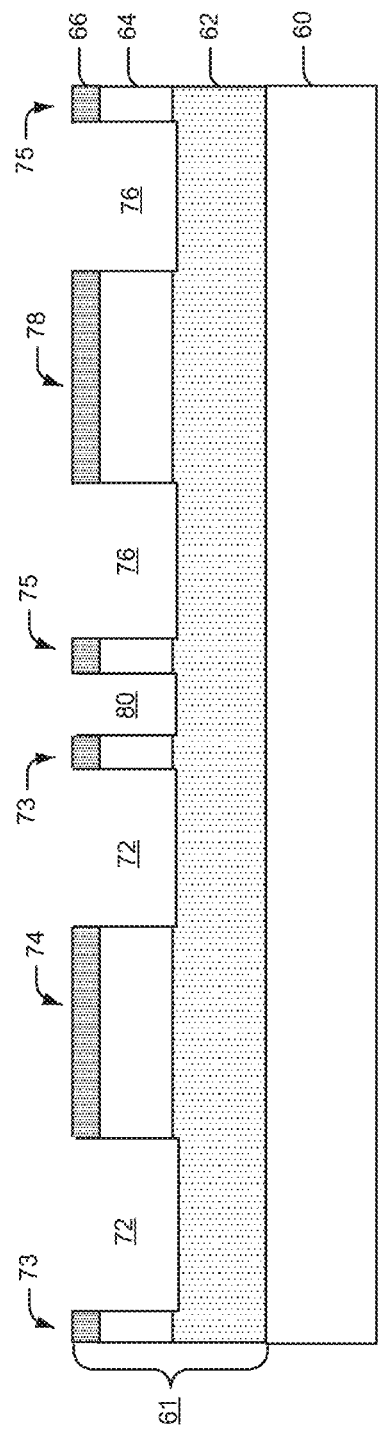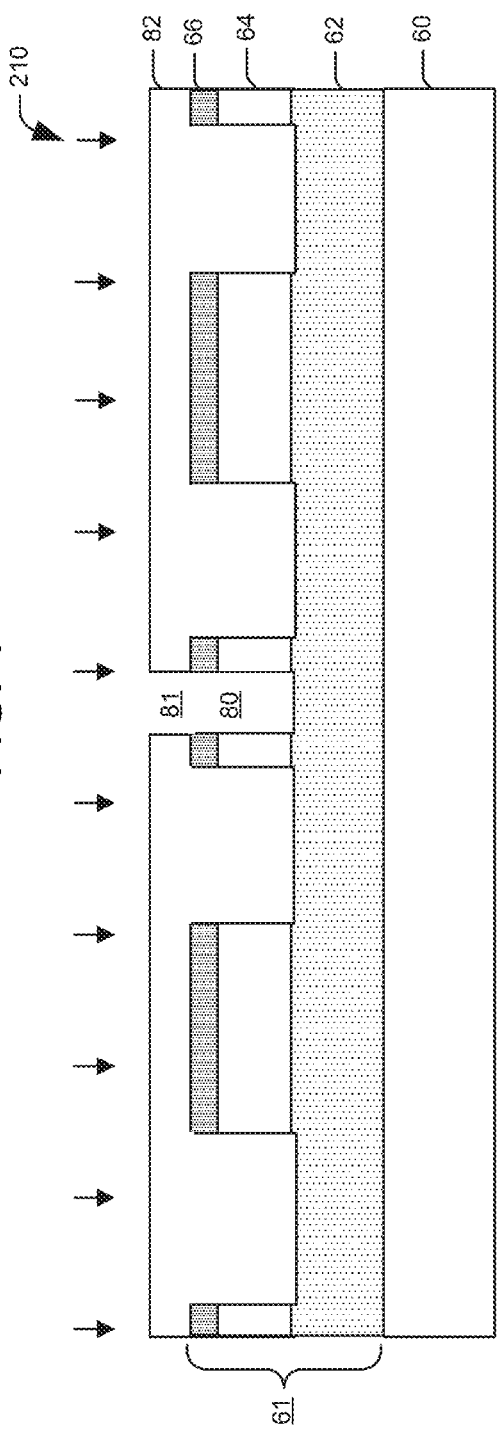

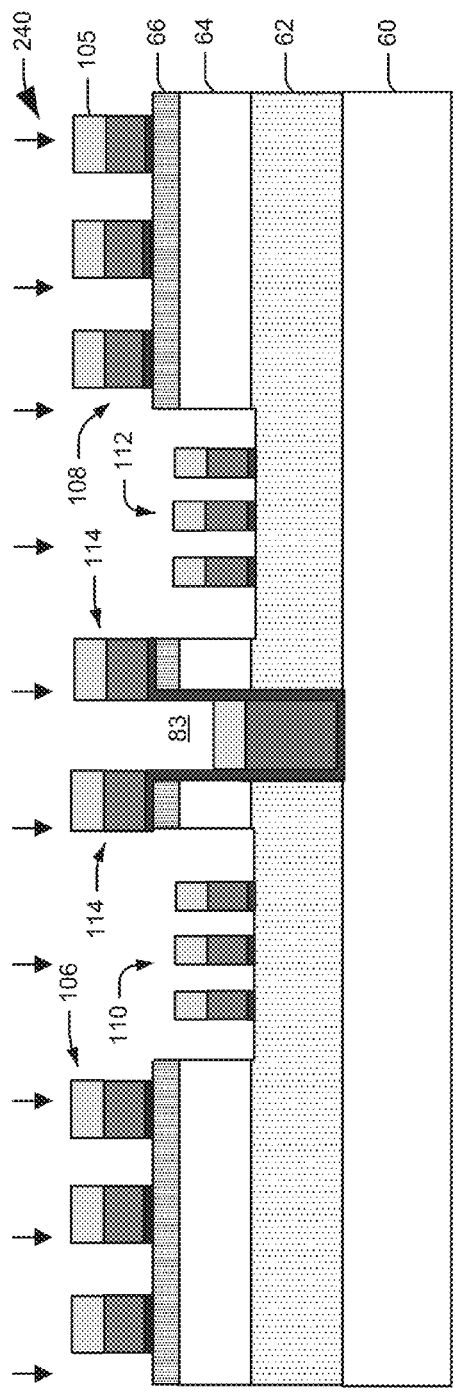
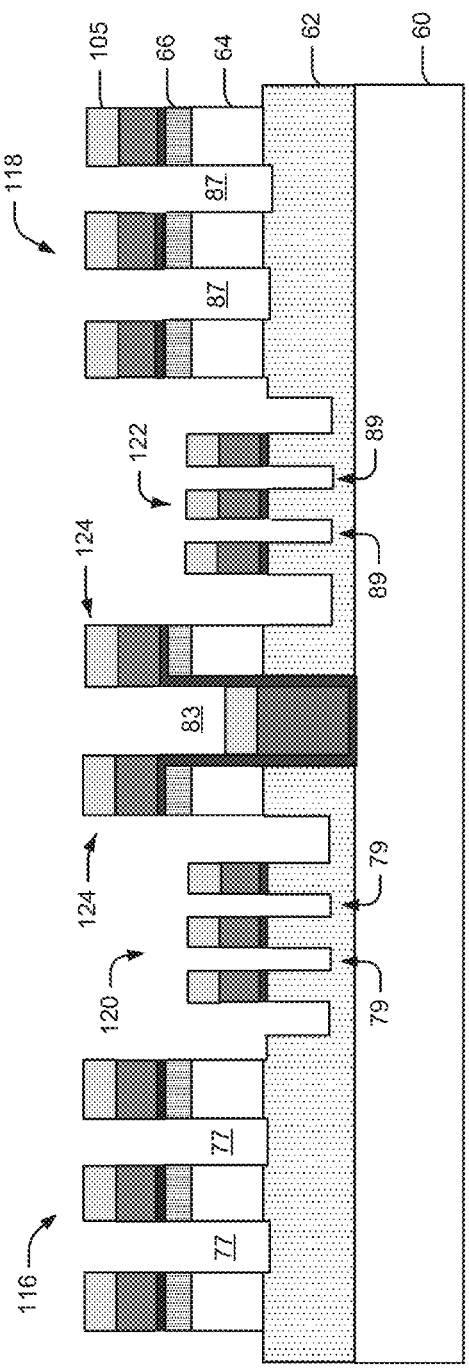
FIG. 12
FIG. 13

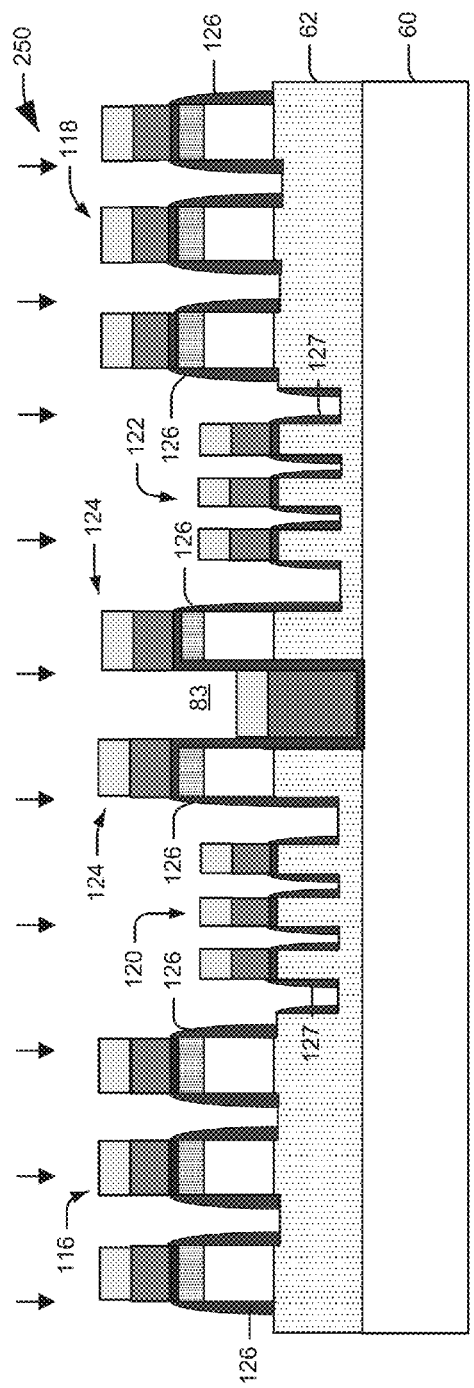
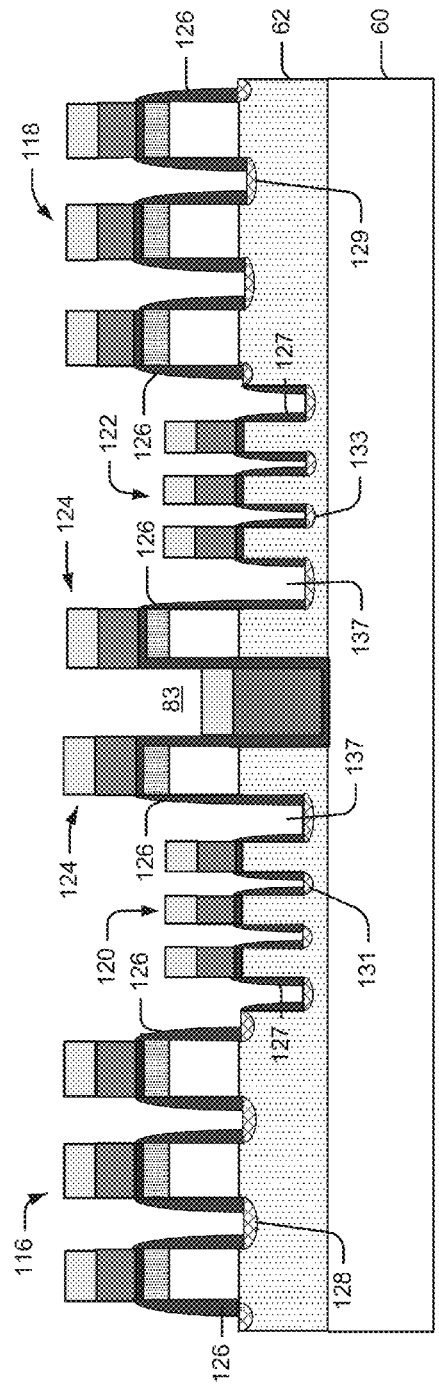

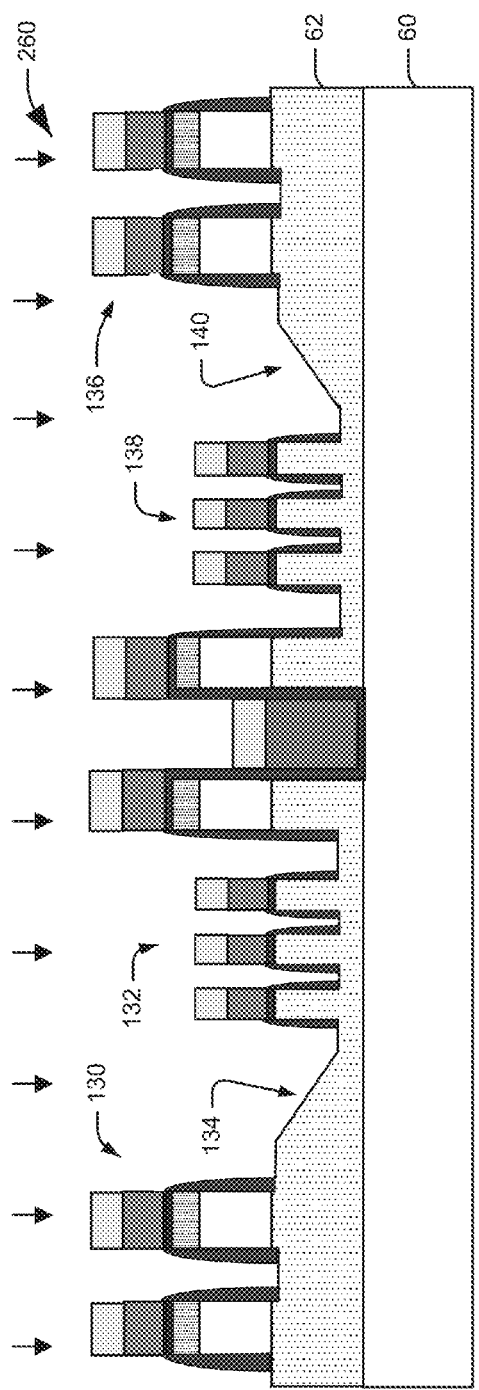
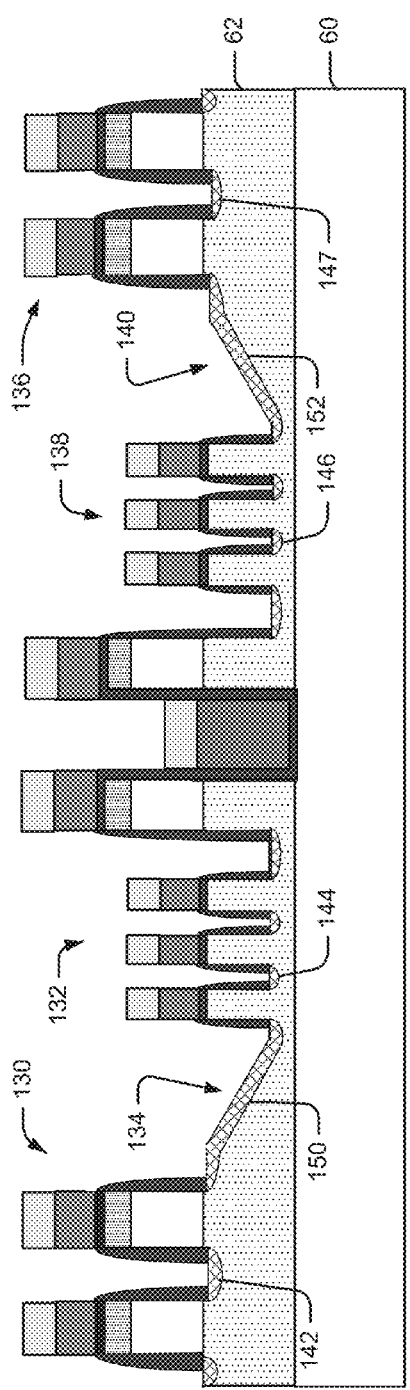
FIG. 16
FIG. 17

MONOLITHIC BI-DIRECTIONAL CURRENT CONDUCTING DEVICE AND METHOD OF MAKING THE SAME

RELATED APPLICATIONS

This application is a continuation of U.S. patent application Ser. No. 14/483,851, filed 11 Sep. 2014, which is incorporated herein in its entirety.

BACKGROUND

Inverters/rectifiers and DC/DC converters critical for supporting high-power, high-voltage systems, such as hybrid-electric ground vehicle propulsion systems, typically operate between two high voltage busses with bi-directional power flow of up to hundreds of kilowatts. To prevent system damage during fault conditions, bi-directional fault isolation, or power conditioning, is needed. Because mechanical contactors do not provide adequate actuation times and suffer severe degradation during repeated fault isolation, a solid-state circuit breaker (SSCB) is desirable.

To provide such a SSCB, and to enable such bi-directional power flow in a semiconductor device, the device should provide symmetric current flow in forward and reverse directions and blocking of a specified voltage in forward and reverse directions. In addition, the gate-drive of the bi-directional circuit should operate at high current-gain and high bandwidth with low conduction losses, should allow for fast switching, and should have small physical size, all of which contribute to the bi-directional circuit's efficiency.

SUMMARY

In accordance with an example, a monolithic bi-directional device is provided that provides bi-directional power flow and bi-directional blocking of high-voltages. The device includes a first transistor having a first drain formed over a first channel layer that overlays a substrate, and a second transistor that includes a second drain formed over a second channel layer that overlays the substrate. The substrate forms a common source for both the first transistor and the second transistor.

In accordance with another example, a method of is provided of making a monolithic bi-directional device for providing bi-directional power flow and bi-directional blocking of high-voltages. The method comprises forming a semiconductor structure stack over a doped substrate, where the semiconductor structure stack comprising a heavily doped contact interface layer overlying a lightly doped drift layer overlying a medium doped channel layer, performing an etching process on the semiconductor structure stack to form a first set of drain pillars formed over a first portion of the medium doped channel layer, and a second set of drain pillars formed over a second portion of the medium doped channel layer, and forming drain contacts on the first set of drain pillars and the second set of drain pillars, first gate contacts between the first set of drain pillars and in contact with the first portion of the medium doped channel layer, and second gate contacts between the second set of drain pillars and in contact with the second portion of the medium doped channel layer, and forming a source contact on the substrate.

In accordance with another example, a method is provided of making a monolithic device for providing bi-directional power flow and bi-directional blocking of high-voltages. The method comprises forming a medium doped channel layer over a doped substrate, forming a lightly doped drift layer over the medium doped channel layer, and forming a heavily doped contact interface layer over the lightly doped drift layer. The method further comprises performing a first etching process to remove portions of the heavily doped contact interface layer and the lightly doped drift layer to form a first generally circular or generally rectangular trench opening that defines a first active area mesa and a second generally circular or generally rectangular trench opening that defines a second active area mesa, performing a second etching process to form a first set of drain pillars in the first active area mesa, and a second set of drain pillars in the second set of drain pillars, and forming an isolation region down to the substrate through the medium doped channel layer to the substrate between the first set of drain pillars and the second set of drain pillars to electrically isolate the first set of drain pillars from the second set of drain pillars. The method also comprises forming drain contacts on the first set of drain pillars and the second set of drain pillars, and first gate contacts between pillars of the first set of drain pillars and in contact with a first portion of the medium doped channel layer, and second gate contacts between pillars of the second set of drain pillars and in contact with a second portion of the medium doped channel layer, and forming a source contact on the substrate that forms a common source.

DESCRIPTION OF THE DRAWINGS

The detailed description will refer to the following drawings, wherein like numerals refer to like elements, and wherein:

FIG. 4 illustrates a cross-sectional view of the structure of FIG. 3 after stripping of the patterned photoresist material layer and after undergoing the etching process of FIG. 3.

FIG. 5 illustrates a cross-sectional view of the structure of FIG. 4 after deposition and patterning of another photoresist material layer and while undergoing another etching process.

FIG. 12 illustrates a cross-sectional view of the structure of FIG. 11 after formation of a mask and while undergoing an etching process.

FIG. 13 illustrates a cross-sectional view of the structure of FIG. 12 after undergoing the etching process of FIG. 12.

FIG. 14 illustrates a cross-sectional view of the structure of FIG. 13 after the formation of spacers and while undergoing an implantation process.

FIG. 15 illustrates a cross-sectional view of the structure of FIG. 14 after undergoing the implantation process of FIG. 14.

FIG. 16 illustrates a cross-sectional view of a structure similar to the structure of FIG. 14 but formed by a sloped etching process while undergoing an implantation process.

FIG. 17 illustrates a cross-sectional view of the structure of FIG. 16 after undergoing the implantation process of FIG. 16.

DETAILED DESCRIPTION

Figure 1:
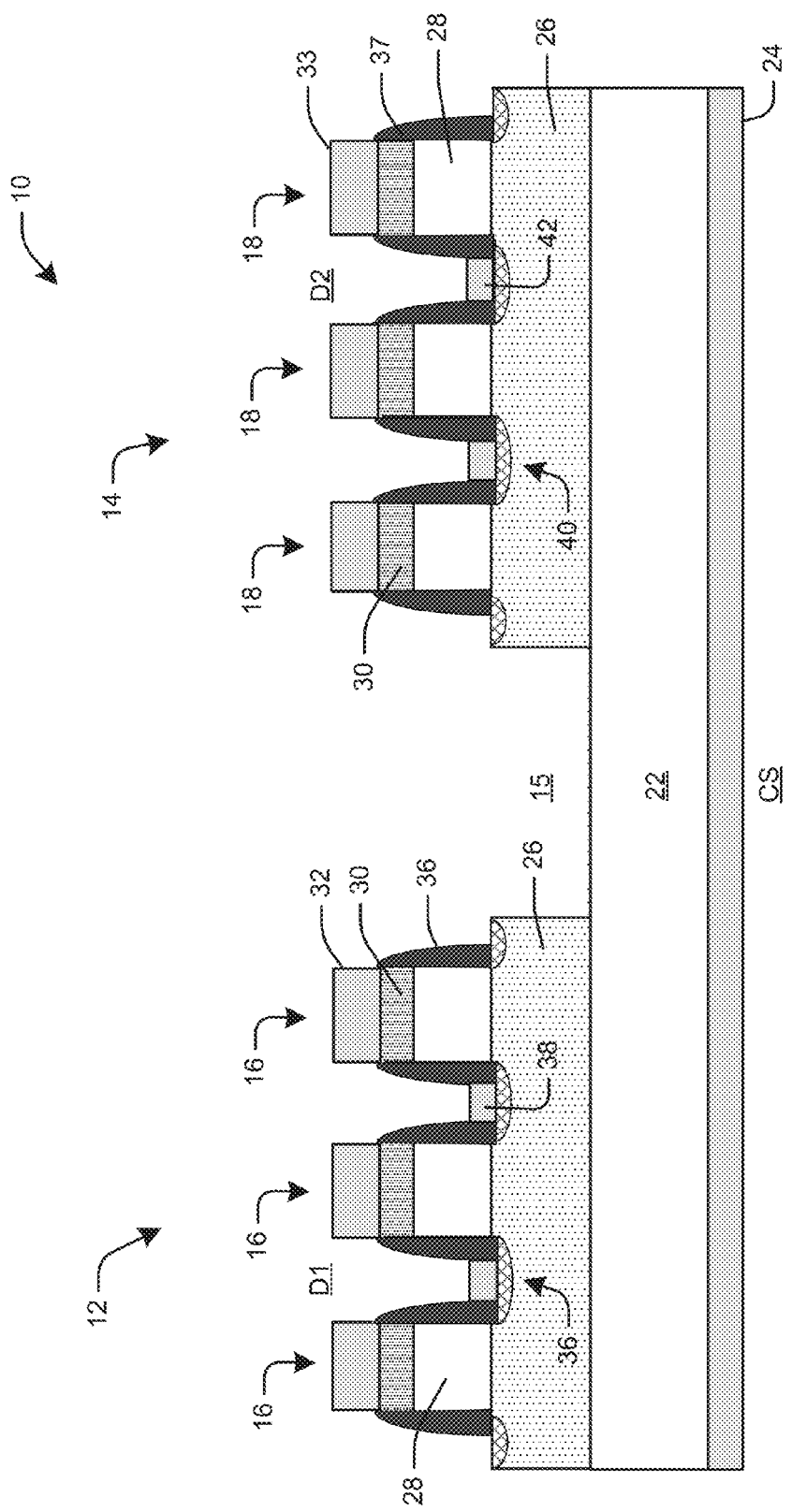
FIG. 1 illustrates a cross-sectional view of an example of a monolithic bi-directional power flow semiconductor device.

The present disclosure relates to a monolithic bi-directional power flow semiconductor device and a method of making the same. The bi-directional power flow semiconductor device provides symmetric, efficient bi-directional power flow and power conditioning, while also blocking high voltages bi-directionally. In one example, the monolithic bi-directional power flow semiconductor device includes two series connected junction field-effect transistors (JFETs) coupled in a common source configuration, such as that disclosed in commonly owned U.S. Pat. No. 8,130,023, entitled "System and Method for Providing Symmetric, Efficient Bi-directional Power Flow and Power Conditioning", the entire contents of which is incorporated herein.

It is to be appreciated that although the present example will be illustrated with respect to JFETs, the two series connected devices can be a variety of different transistor types, such as other field-effect transistors (FET), vertical-junction field-effect transistors (VJFETs) based, ion-implanted-static-induction-transistor (SITs) based, metal semiconductor field effect transistors (MESFETs) based, metal-oxide-semiconductor field-effect transistors (MOSFETs) based, bipolar junction transistors (BJTs) based, insulated-gate bipolar transistors (IGBTs) based, and any vertical semiconductor transistor device that blocks voltage.

The exemplary Monolithic Bi-directional semiconductor device may be, for example, a silicon carbide (SiC) power device. SiC power devices exhibit high breakdown voltage, lower thermal impedance due to superior thermal conductivity, higher frequency performance, higher maximum current, higher operating temperature, wider band-gap, and improved reliability, particularly in harsh environments. However, one skilled in the art will appreciate that the Monolithic Bi-directional semiconductor device can be fabricated using various other semiconductor materials, including but not limited to diamond, Galium Arsenide (GaAs), and Galium Nitride (GaN) based material like III-N nitrides such as Aluminum Galium Nitride (AlxGaN1-x)/GaN, and Indium Galium Nitride (InyGa1-yN)/GaN.

This description is intended to be read in connection with the accompanying drawings, which are to be considered part of the entire written description of this invention. The drawing figures are not necessarily to scale and certain features of the invention may be shown exaggerated in scale or in somewhat schematic form in the interest of clarity and conciseness. In the description, relative terms such as "front," "back," "up," "down," "top" and "bottom," as well as derivatives thereof, should be construed to refer to the orientation as then described or as shown in the drawing figure under discussion. These relative terms are for convenience of description and normally are not intended to require a particular orientation. Terms concerning attachments, coupling and the like, such as "connected" and "attached," refer to a relationship wherein structures are secured or attached to one another either directly or indirectly through intervening structures, as well as both movable or rigid attachments or relationships, unless expressly described otherwise.

FIG. 1 illustrates an example of a monolithic bi-directional power flow semiconductor device 10. The device 10 is formed of a first JFET 12 connected in series with a second JFET 14 formed on a single integrated device 22 (e.g., wafer substrate). The first JFET 12 includes a first drain (D1) formed from a first set of drain pillars 16 with each drain pillar 16 having a drain contact 32 disposed on top of each respective drain pillar 16. The second JFET 14 includes a second drain (D2) formed from a second set of drain pillars 18 with each of the second set of drain pillars 18 having a drain contact 33 disposed on top of each respective drain pillar 18. Each of the first set of drain pillars 16 of the first JFET 12 and the second set of drain pillars 18 of the second JFET 14 are formed from a same highly doped drain contact interface layer 30 and a same lightly doped drift layer 28 overlying a same medium doped channel layer 26. It is to be appreciated that a set is defined as one or more drain pillars.

The first set of drain pillars 16 of the first JFET 12 are separated from the second set of drain pillars 18 of the second JFET 14 by an isolation region 15. The isolation region 15 can include respective edge termination structures, and respective electric field stop regions disposed about each of the first and second set of drain pillars 16 and 18 that both facilitate the maximization of the break down voltages of the first and second JFETs 12 and 14. For example, the plurality of first set of drain pillars 16 can be formed in a generally circular or generally rectangular structure with a first generally circular or generally rectangular edge termination substantially surrounding the periphery of the first set of drain pillars 16. Further, an electric field stop region can substantially surround the periphery of the first generally circular or generally rectangular edge termination.

The plurality of second set of drain pillars 18 can be formed in a generally circular or generally rectangular structure with a second generally circular or generally rectangular edge termination substantially surrounding the periphery of the second set of drain pillars 18. Further, an electric field stop region can substantially surround the periphery of second generally circular or generally rectangular edge termination. The isolation region 15 can also include an isolation region disposed between the first and second set of drain pillars 16 and 18 and the channel layer 26 to isolate the two JFET structures from one another. The isolation region 15 separates the first and second JFETs 12 and 14 by extending down to the substrate 22. The isolation region 15 can be formed by forming an opening between the two JFET structures and filling the opening with a dielectric, or ion bombardment of the area to form a highly resistive isolation region.

A first set of gate contacts 38 resides in openings formed between each of the first set of drain pillars 16, and a second set of gate contacts 42 resides in openings formed between each of the second set of drain pillars 18. The first set of gate contacts 38 overly channel doped regions 36 residing in the medium doped channel layer 26, and the second set of gate contacts 42 overly channel doped regions 40 in the medium doped channel layer 26. The medium doped channel layer 26 overlies a shared substrate 22 (e.g., a wafer) that forms a common source (CS) for both the first JFET 12 and the second JFET 14. A source contact 24 is formed on the bottom of the substrate 22, for example by flipping the semiconductor structure 10, and metalizing the bottom of the substrate 22 to form the source contact 24.

In D1 to D2 conduction, current enters from the first drain pillars 16 of D1, and through the common source CS and exits through the second set of drain pillars 18 of D2. In D2 to D1 conduction, current enters from the second set of drain pillars 18 of D2, and through the common source CS and exits through the first set of drain pillars 16 of D1. This ensures symmetric bidirectional conduction. In blocking voltage mode, if a fault leads to a high voltage on D1, the high voltage is held-off by the D1 drain pillars 16 assisted by the existence of the drift layer 28. If a fault leads to a high voltage on the D2 drain pillars 18, the high voltage is held-off by the D2 drain pillars 18 assisted by the existence of the drift layer 28. Thus, bidirectional blocking is materialized.

Figure 2:
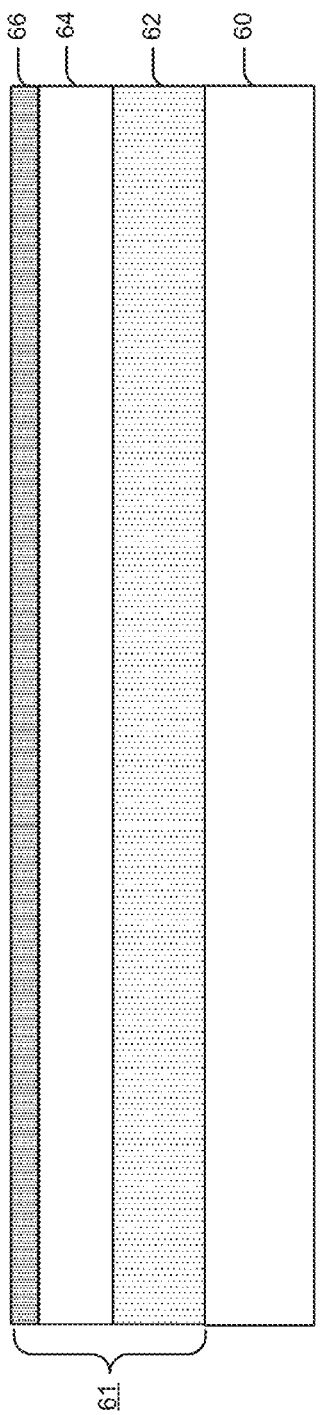
FIG. 2 illustrates a cross-sectional view of a semiconductor device in its early stages of fabrication.

Turning now to FIGS. 2-15, fabrication is discussed in connection with formation of a monolithic bi-directional power flow semiconductor device as discussed in FIG. 1. FIG. 2 illustrates a cross-sectional view of a semiconductor device in its early stages of fabrication. A semiconductor structure stack 61 is disposed over a substrate 60. Any suitable technique for depositing each layer of the semiconductor structure stack 61 can be employed such as metal organic chemical vapor deposition (MOVCD), molecular beam epitaxy (MBE) or other suitable deposition techniques. The semiconductor structure stack 61 includes a medium doped channel layer 62 overlying the substrate 60, a lightly doped drift layer 64 overlying the medium doped channel layer 62 and a highly doped drain contact interface layer 66 overlying the lightly doped drift layer 64. The substrate 60 can be highly conductive (n+) and can include buffer layers, which are also highly conductive n+ doped layers, for strain relief and for subsequent high quality epitaxial layer growth.

In one example, the semiconductor layer stack 61 contains a medium doped n channel layer 62, a lightly doped n– drift layer 64, and a heavily doped n+ contact interface layer 66 on top of the lightly doped n– drift layer. Typically, the lightly doped n-drift layer 64 is about 0.5 to about 100 um thick and has a dopant concentration of about $10^{12}$ to about $10^{16}$ atoms/cm$^3$, the medium doped n channel layer 62 is about 0.5 to about 100 um thick and has a dopant concentration of about $10^{14}$ to about $10^{18}$ atoms/cm$^3$, and the heavily doped n+ contact interface layer 66 is about 0.1 to about 10 um thick and has a dopant concentration in excess of about $10^{18}$ atoms/cm$^3$. In another example, the semiconductor layer stack 61 contains only two layers, a lower layer (that serves as a channel and drift layer) and an upper layer having a dopant concentration that is higher than the dopant concentration in the lower layer. In another example, the lower layer has a dopant concentration of about $10^{12}$ to about $10^{18}$ atoms/cm$^3$ and the upper layer has a dopant concentration in excess of about $10^{18}$ atoms/cm$^3$.

The substrate 60 may be any material upon which a semiconductor layer can be deposited. Examples of suitable substrate material include, but are not limited to, SiC, GaAs, group III metal nitrides such as GaN, $Al_xGa_{1-x}N$/GaN, $In_xGa_{1-x}N$/GaN, Si, sapphire, and diamond, wherein 0<x<1. In yet another example, the substrate includes a top buffer layer that is in direct contact with the semiconductor layer stack 61 and separates the semiconductor layer stack 61 from the rest of the substrate. The top buffer layer can be a semiconductor layer such as SiC, GaAs, group III metal nitride such as GaN, $Al_xGa_{1-x}N$/GaN, and $In_xGa_{1-x}N$/GaN, Si, and diamond, wherein 0<x<1.

In the present example, the semiconductor device processing typically begins by etching, via a vertical etching process or sloped etching process, the semiconductor stack 61 to the drift layer 64 or the channel layer 62 using a resist or other standard lithography selective etch mask to form vertical or sloped active mesas that form a portion of the active areas of the monolithic bi-directional power flow semiconductor device. The slope of each active area mesa can be about 1° to about 89°.

Further, to maximize the breakdown voltage, electric field stop regions, i.e., n+ field stop regions, having highly doped n+ material (in excess of $10^{18}$ atoms/cm$^3$) may be concurrently formed about the active areas of the device to terminate the electric field distribution at the periphery of each active device. Additionally, edge terminations (e.g., guard rings) can be concurrently formed in the lightly doped drift layer or the channel layer situated between the active areas and the electric field stop regions to further maximize the breakdown voltage of the monolithic bi-directional semiconductor device. Alternatively, the area between the active areas can be fully etched (no resist layers are present at the periphery of each active device to stop etch) and n+ electric field stop regions can be formed by selectively implanting n+ regions between the active area mesas.

Electric field crowding at peripheries, i.e., edges, of a semiconductor device may lead to premature voltage breakdown, which adversely affects the breakdown voltage capability of the device. To minimize premature voltage breakdown at peripheries of the device, specialized edge termination techniques have been developed to reduce or prevent the electric field crowding at the peripheries of the device. Examples of edge termination techniques include moat etch, surface implantation, bevel edge, field plate terminations, guard rings and junction termination extensions (JTE). The two primary techniques for terminating high voltage blocking devices made of compound semiconductors are junction termination extensions (JTE) and multiple floating guard ring edge termination.

With respect to the JTE, a p-type doped region is formed at the periphery of the main p/n junctions of the active area for precise control of the depletion region charge. Implementing the JTE edge termination in a lightly doped n– drift layer or an n channel layer is advantageous as it allows for lower doping levels and energies and for an electric field distribution at a lower differential (dE/dx or dE/dy) that increases breakdown voltage capability. Implementing the JTE edge termination in a lightly doped drift layer or a channel layer requires etching away the heavily n-doped top layer material in the periphery of the device.

In the following, a process of forming a monolithic bi-directional semiconductor device using a guard ring edge termination formed between active area mesas and respective electric field stop regions will be described for illustration purposes, such as that disclosed in commonly owned U.S. Pat. No. 7,825,487, entitled "Guard Ring Structures and Method of Fabricating Thereof", the entire contents of which is incorporated herein. As stated above, a variety of edge termination techniques could be employed to facilitate blocking of electric fields due to high voltages.

The multiple floating guard ring edge termination reduces the amount of field crowding at the main junction by spreading the depletion layer past consecutively lower potential floating junctions (rings). These independent junctions act to increase the depletion layer spreading, thereby decreasing the high electric field at the edges of the main junction. It is also advantageous to implement the multiple floating guard ring edge termination in the lightly doped drift layer or the channel layer (as opposed to the heavily doped source or drain contact interface layer) as this allows for wider spacing between guard rings and thus can increase fabrication tolerances.

Figure 3:
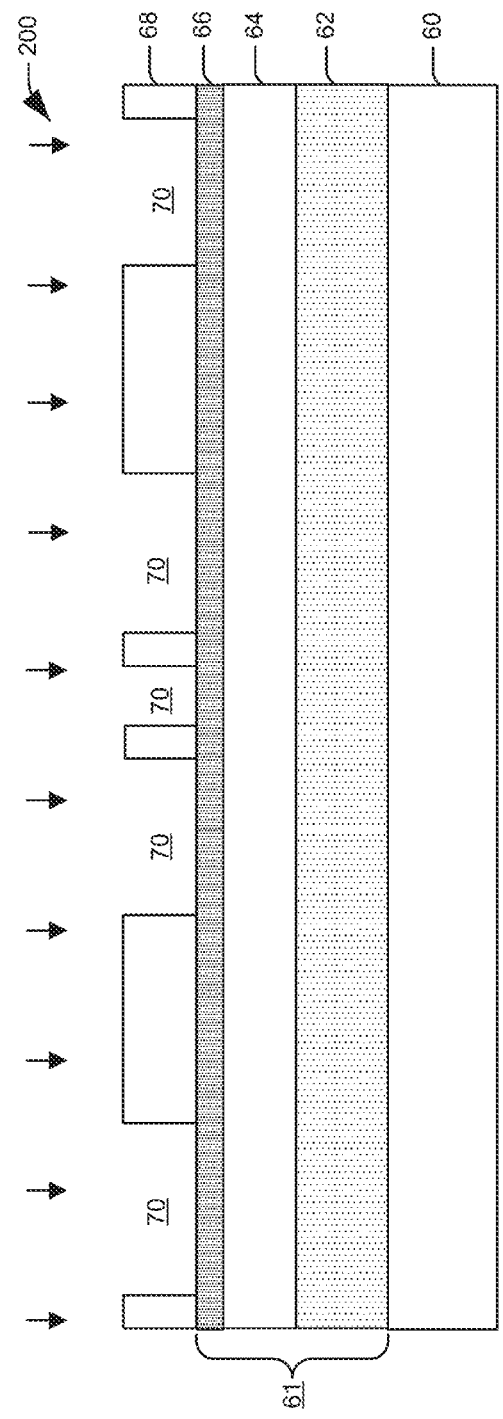
FIG. 3 illustrates a cross-sectional view of the structure of FIG. 2 after deposition and patterning of photoresist material layer and while undergoing an etching process.

As discussed above, a photoresist material layer 68 is deposited over the semiconductor structure stack 61 and patterned and developed to provide openings 70 over the heavily doped drain contact interface layer 66, as illustrated in FIG. 3. The photoresist material layer 68 can have a thickness that varies in correspondence with the wavelength of radiation used to pattern the photoresist material layer 68. The photoresist material layer 68 may be formed over the semiconductor structure stack 61 via spin-coating or spin casting deposition techniques, selectively irradiated and developed to form the openings 70. The resist mask protects and preserves the portions of the semiconductor structure stack 61 during etching by an etching process 200 of the highly doped drain contact interface layer 66 to the lightly doped drift layer 64 or the medium doped channel layer 62 to form active area mesas 74 and 78 and electric field stop regions 73 and 75 (FIG. 4). The resist mask may be, for example, about 4 to about 50 microns thick. Portions of the resist mask may be, for example, about 0.1 to about 10000 microns wide.

The resultant structure is illustrated in FIG. 4 after stripping of the photoresist material layer 68. FIG. 4 illustrates the monolithic semiconductor device, with a generally circular or generally rectangular first active area mesa 74 disposed within a generally circular or generally rectangular first trench opening 72 and a generally circular or generally rectangular second active area mesa 78 disposed within a generally circular or generally rectangular second trench opening 76. A first electric field stop region 73 is formed about the outer periphery of a first generally circular or generally rectangular trench opening 72, and a second electric field stop region 75 is formed about the outer periphery of the second generally circular or generally rectangular trench opening 76. As previously stated, the electric field stop regions 73 and 75 assist in maximizing the breakdown voltage of the monolithic bi-directional semiconductor device. An isolation region opening 80 is formed between the first electric stop region 73 and the second electric stop region 75 to separate the first and second JFETs that form the monolithic bi-directional semiconductor device.

One skilled in the art will appreciate that other thicknesses and widths of the resist mask 68 can be used to create the active area mesas 74 and 78 and electric field stop regions 73 and 75. A person of ordinary skill in the art would understand that the active area mesa structures can be created using many other methods known in the art. For example, instead of a resist mask, a dielectric mask or a metal mask or a combination of those may be formed and used to create the mesa structures.

Next, another photoresist material layer 82 is deposited over the semiconductor structure stack 61 and patterned and developed to provide an opening 81 overlying the isolation region opening 80, as illustrated in FIG. 5. FIG. 5 also illustrates another etching process 210 by etching and extending the isolation region opening 80 down to the substrate 60 to form an extended isolation region opening 83 (FIG. 6).

Figure 6:
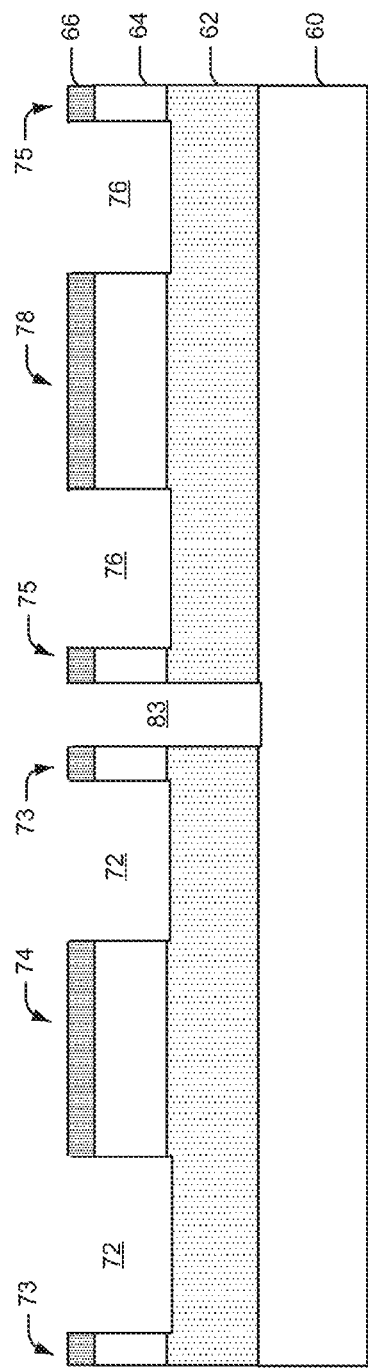
FIG. 6 illustrates a cross-sectional view of the structure of FIG. 5 after stripping of the patterned photoresist material layer and after undergoing the etching process of FIG. 5.

The resultant structure is illustrated in FIG. 6 after stripping of the photoresist material layer 82 to provide a periodic cell of the monolithic bi-directional semiconductor device, which consists of two active area mesas 74 and 78 each with a periphery trench opening 72 and 76, respectively, in which edge terminations are to be formed. At the outer edge of the periphery of each trench opening 72 and 76, electric field stop regions 73 and 75, respectively, are present. Each mesa with its periphery and electric field stop region is separated from the adjacent mesa through an etch down to the substrate 60 to form the extended isolation region 83. The monolithic bi-directional semiconductor device can include a single or hundreds of thousands of cells. Given that the substrate 60 is typically hundreds of microns thick, an over etch of a few microns can ensure that the channel area has been fully etched. The width of the distance between the adjacent electric field stop regions 73 and 75 can be about 0.5 to about 50 um.

As previously stated, the device processing, (e.g., mesa etch) can be performed vertically or along a slope, and can be done with standard lithographic selective etch masking method combinations of resist patterns, dielectric patterns, or metal patterns. Therefore, a wide-angled mesa structure may be formed over the semiconductor layer stack using standard 'slope etching' techniques, which for example can include forming a thermally reflowed resist mask, or a sloped dielectric mask.

Figure 7:
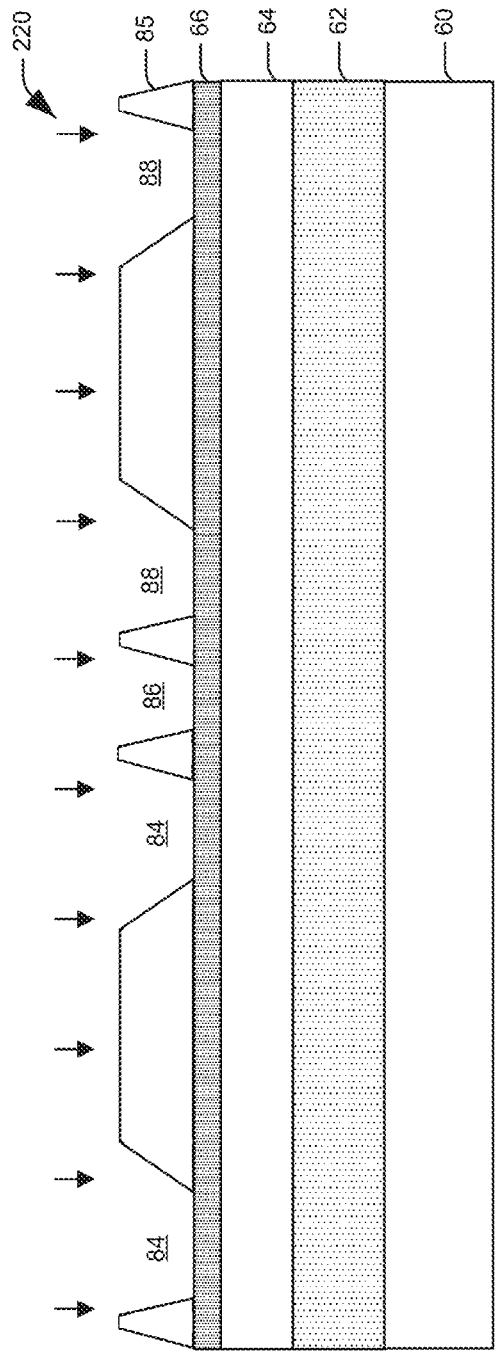
FIG. 7 illustrates a cross-sectional view of the structure of FIG. 2 after deposition and patterning of a photoresist material layer with sloped openings and while undergoing a sloped etching process.

FIG. 7 illustrates the depositing of a photoresist material layer 85 over the semiconductor structure stack 61 of FIG. 2, which is patterned and developed to provide sloped openings 84, 88, and 86 overlying the semiconductor structure stack 61. FIG. 7 also illustrates a sloped etching process 220 by etching and extending the sloped openings 84, 88, and 86 down to the medium doped channel layer 62 or the lightly doped drift layer 64 to form extended sloped openings 90 and 94 with an isolation region opening 98 being formed in the middle of the device. The resultant structure is illustrated in FIG. 8 after stripping of the photoresist material layer 85.

Figure 8:
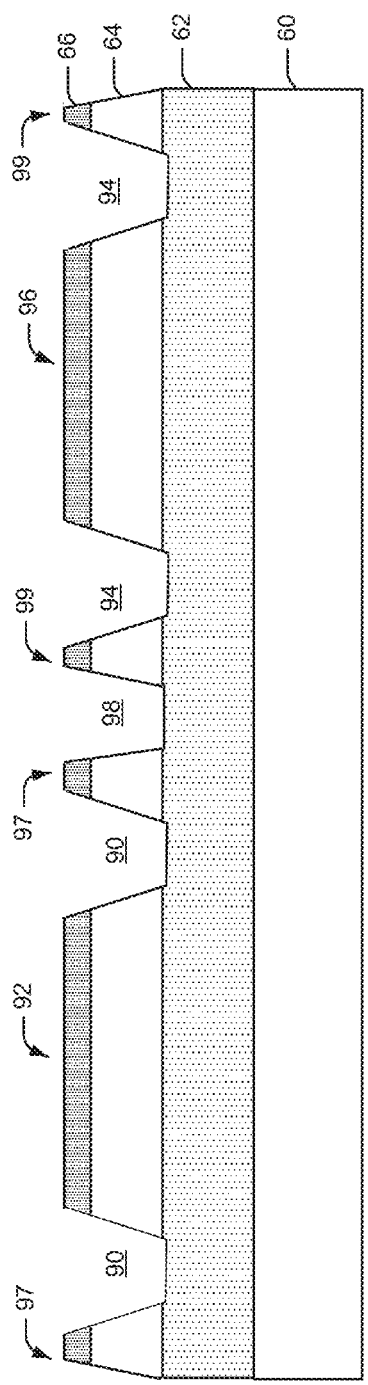
FIG. 8 illustrates a cross-sectional view of the structure of FIG. 7 after stripping of the patterned photoresist material layer and after undergoing the sloped etching process of FIG. 7.

FIG. 8 illustrates the monolithic semiconductor device, with a generally circular or generally rectangular first active area mesa 92 having sloped outer end walls disposed within a generally circular or generally rectangular first trench opening 90 and a generally circular or generally rectangular second active area mesa 96 having sloped end walls disposed within a generally circular or generally rectangular second trench opening 94. A first electric field stop region 97 having a sloped end wall facing the first active area mesa 92 is formed about the outer periphery of the first generally circular or generally rectangular trench opening 90, and a second electric stop region 99 having a sloped end wall facing the second active area mesa 96 is formed about the outer periphery of the second generally circular trench opening 94. A subsequent photoresist material deposition and patterning and a subsequent etching process similar to that shown in FIG. 7 can be performed to extend isolation region opening 98 down to the substrate 60.

Figure 9:
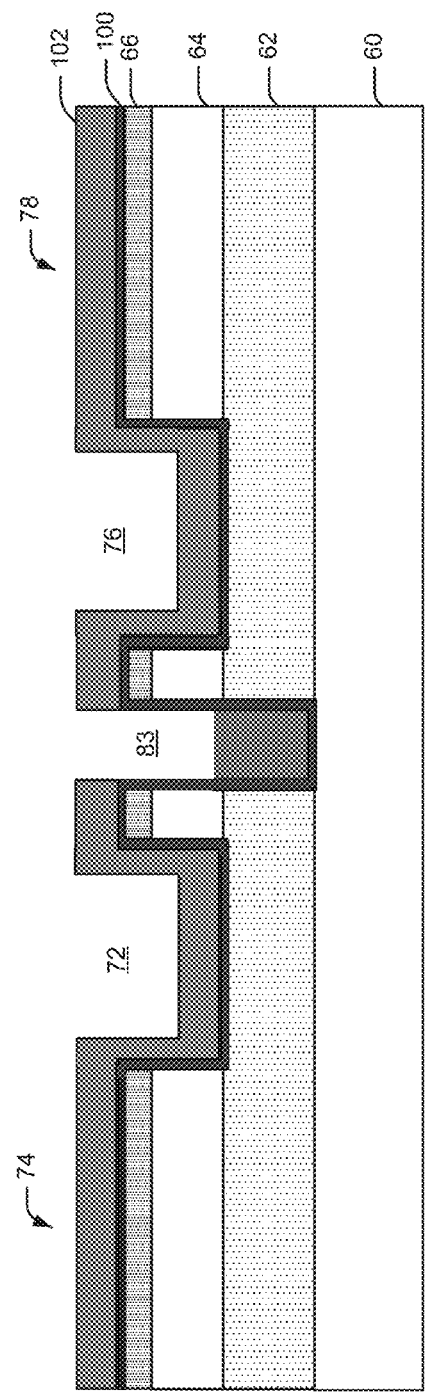
FIG. 9 illustrates a cross-sectional view of the structure of FIG. 6 after coating of a dielectric layer.

Returning to the processing of the mesas with vertical ends, the mesa structure of FIG. 6 is coated with a dielectric layer to provide the resultant structure of FIG. 9. The remaining FIGURES are illustrated with respect to the drain pillars and inner portion of the guard ring pillars for simplicity purposes. However, it is to be appreciated that the outer portion of the guard ring pillars are substantially similar to the inner portion of the guard ring pillars. The dielectric layer may be thermally grown or deposited using a deposition technique well known in the art, such as chemical vapor deposition (CVD), physical vapor deposition (PVD) or sputtering. In one example, the dielectric layer is formed by thermally growing a thin oxide layer 100 on the surface of the semiconductor structure to ensure good adhesion, and then depositing a thicker dielectric layer 102 on top of the oxide layer 100. In another example, the dielectric layer contains tetraethyl orthosilicate (TEOS).

Figure 10:
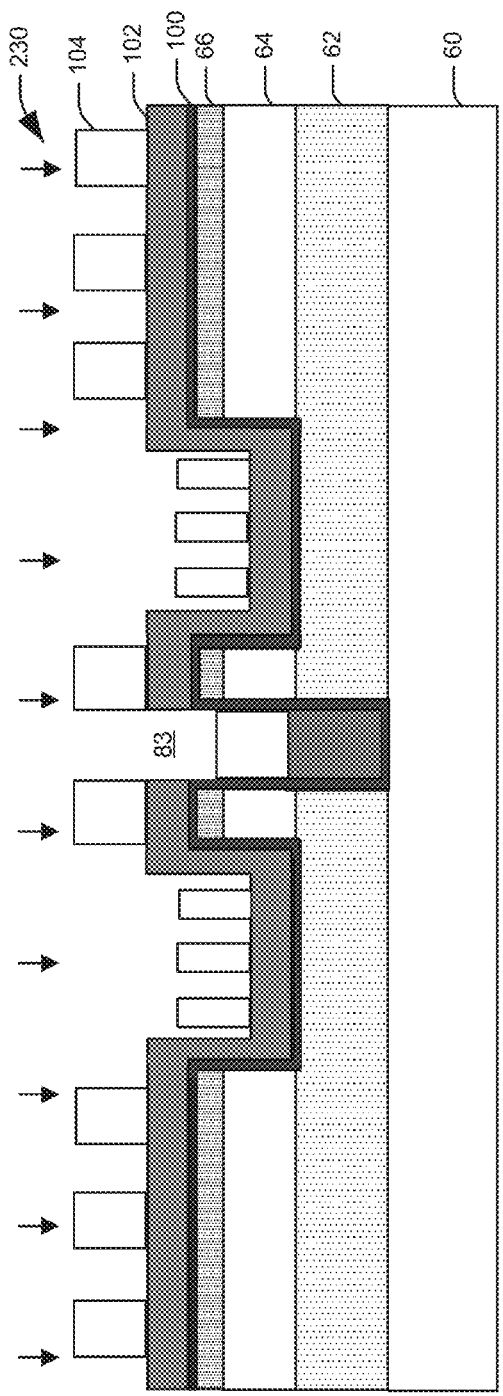
FIG. 10 illustrates a cross-sectional view of the structure of FIG. 9 after deposition and patterning of a photoresist material layer and while undergoing an etching process.
Figure 11:
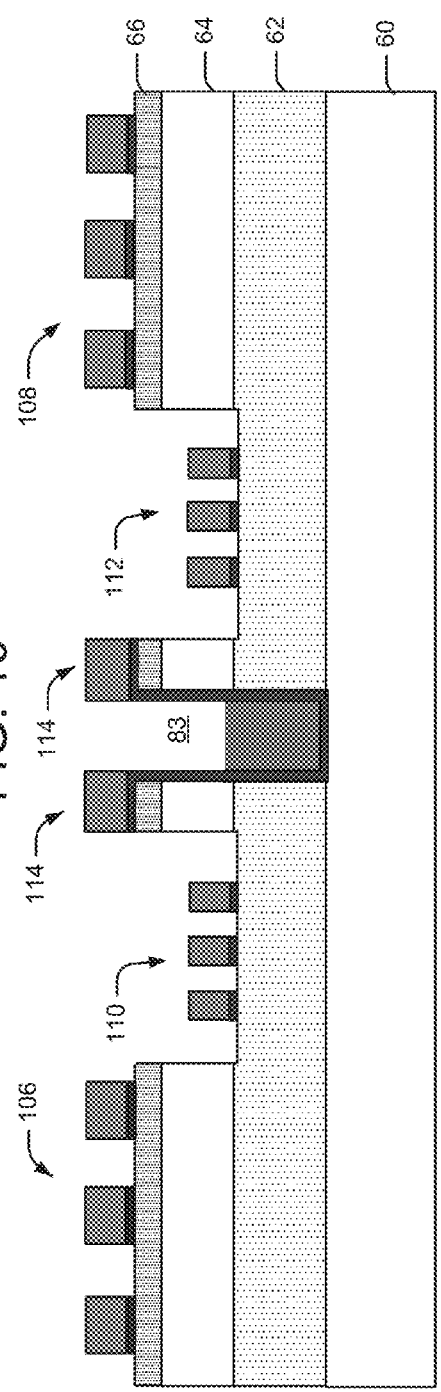
FIG. 11 illustrates a cross-sectional view of the structure of FIG. 10 after stripping of the patterned photoresist material layer and after undergoing the etching process of FIG. 10.

As illustrated in FIG. 10, the dielectric layer 102 of FIG. 9 is coated and patterned with a photoresist material layer 104 to form patterned openings in the photoresist material layer 104. A person of ordinary skill in the art would understand that the patterned openings can be created using many other methods known in the art. For example, instead of a resist mask, a dielectric mask or a metal mask or a combination of those may be formed and used to create the patterned openings. FIG. 10 also illustrates the structure undergoing an etching process 230 to remove portions of the dielectric layer 102 and the oxide layer 100 to extend the patterned openings in the photoresist material layer 104 to form drain pillars 106 and 108, guard ring pillars 110 and 112, and electric field stop pillars 114 with the remaining portions of the oxide layer 100 and the dielectric layer 102 (FIG. 11). The photoresist mask protects and preserves portions of the dielectric layer 102 and the oxide layer 100 that form the drain pillars 106 and 108, the guard ring pillars 110 and 112, and electric field stop pillars 114. FIG. 11 illustrates the resultant drain pillars 106 and 108, guard ring pillars 110 and 112, and electric field stop pillars 114 after the etching process 230 and after stripping of the patterned photoresist material layer 104.

Referring now to FIG. 12, a metal layer 105 is sputtered, evaporated or blanket deposited on a patterned resist. The patterned resist is removed, lifting off portions of the metal layer that is on the patterned resist, therefore leaving exposed areas on the top contact interface layer 66 in the active area mesas and the channel layer 62 in the guard ring region, and covering the remaining portions to provide a metal mask. In the example shown in FIG. 12, an etch 240 is also performed to create trenches 77 and 87 in the active area mesas for gate structures, and trenches 79 and 89 in the guard ring regions for guard ring contacts. The etching process is stopped when the trenches 77 and 87 and 79 and 89 reach into the channel layer 62 of the active area mesas, as illustrated in FIG. 13. In one example, the trenches, which start at the channel layer 62, are now formed entirely into the channel layer 62. The simultaneous etching of the trenches for gates and guard rings with the same metal mask allows for the precise alignment of trenches for gates and guard rings.

Referring now to FIG. 14, a thermally grown oxide or deposited dielectric layer is optionally formed in the gate trenches 77 and 87 and guard ring trenches 79 and 89. The oxide or dielectric layer is etched away at the bottom of the trenches to expose the channel layer 62 and form side spacers 126 and 127 for the drain pillars 116 and 118 and the guard ring pillars 120 and 122, as illustrated in FIG. 15. A p-type material, such as boron, aluminum, or a combination thereof, is then implanted into the trenches by an ion implantation 250 to form doped regions 128 and 129 in between the drain pillars 116 and 118 and doped regions 131 and 133 between the guard ring pillars 120 and 122 to form, after an anneal process, the semiconductor device's gates and guard rings. The side spacers isolate the implanted p-type material from implanting exposed areas where implantation is not desirable. The structure can then go through a contact formation process to form source contacts on the substrate 60, gate contacts between the drain pillars, and drain contacts on top of the drain pillars. In another example, the trenched regions between the outermost guard rings and the electric field stop regions 124 are not implanted or are partially implanted. This is accomplished by fully or partially masking, respectively, the trenched regions, by extending the masking material of electric field stop regions 124.

By using one mask level to simultaneously define the gates and guard rings, the gates are self-aligned to the guard rings. The self-aligned fabrication process ensures that correct spacing between the active area and the first guard ring, as well as the floating guard ring widths and spacings, are not affected by alignment tolerances, variations in wafer curvature, and other factors known to those skilled in the art to cause the problems observed in non self-aligned lithography processes. As a result, the separation between the outermost gate and the innermost guard ring (an important parameter in maximizing breakdown voltage), as well as the separation between the floating guard rings, is maintained.

FIG. 16 illustrates a similar structure as that of FIG. 14 for active area mesas with sloped ends 134 and 140, as those illustrated in FIG. 8. A p-type material, such as boron, aluminum, or a combination thereof, is implanted into the trenches by an ion implantation 260 to form doped regions 142 in between drain pillars 130, doped regions 147 in between drain pillars 136, doped region 144 between guard ring pillars 132, and doped region 146 between guard ring pillars 138, as illustrated in FIG. 17. FIG. 17 also illustrates that the outermost gate and the innermost guard ring are spaced to have overlapping depletion regions under operation. Even in the vertical sidewall case of FIG. 14, the etching step will not provide perfectly vertical mesa sidewall surfaces, and there will be a narrow-angled sloped surface between the outermost gate and the innermost guard ring. This surface will be covered with the ion implantation region 150 that joins the outermost gate of drain pillars 130 to the innermost guard ring of guard ring pillars 132, and ion implantation region 152 that joins the outermost gate of drain pillars 136 to the innermost guard ring of guard ring pillars 138.

A person of ordinary skill in the art would understand that the number of the gates and the number of guard rings are not limited to the numbers shown in the figures, and are subjected to optimization for each specific application. Similarly, the width of the trenched gates and the trenched guard rings, as well as the distances between gates and between the guard rings, are not limited to the distances shown in the figures, and are subjected to optimization for each specific application. In one example, the trenched guard rings have a width in the range of about 0.5 to about 10 µm, preferably about 1 to about 6 µm. In another example, the trenched guard rings have a width of about 2 µm. In yet another example, the trenched guard rings have a width of about 4 µm. The spacing between two neighboring guard rings may be constant or variable, and is typically in the range of about 0.5 to about 20 µm. In a further example, the spacing between two neighboring guard rings is variable and is in the range of about 1.5 to about 3.5 µm.

The terms and descriptions used herein are set forth by way of illustration only and are not meant as limitations. Those skilled in the art will recognize that many variations are possible within the spirit and scope of the invention as defined in the following claims, and their equivalents, in which all terms are to be understood in their broadest possible sense unless otherwise indicated.

What is claimed is:

1. A device comprising:
a first transistor having a first drain formed over a first channel layer that overlays a substrate;
a second transistor having a second drain formed over a second channel layer that overlays the substrate, wherein the first drain and the second drain are independent and not shared, wherein the substrate forms a common source for both the first transistor and the second transistor, and wherein the device is a monolithic device for providing bi-directional power flow between the first transistor and the second transistor and bi-directional blocking of high-voltages.

2. The device of claim 1, wherein the bi-directional blocking of high-voltages blocks high voltages associated with the second transistor from the first transistor, and wherein the bi-directional blocking of high-voltages blocks high voltages associated with the first transistor from the second transistor.

3. The device of claim 1, wherein the first drain comprises a first set of drain pillars and the second drain comprises a second set of drain pillars, wherein each drain pillar is formed of a drain contact that overlies a highly doped drain contact interface layer that overlies a lightly doped drift layer.

4. The device of claim 3, further comprising a first set of gates formed over the first channel layer and disposed in between the first set of drain pillars and a second set of gates formed over the second channel layer and disposed in between the second set of drain pillars.

5. The device of claim 4, wherein the common substrate is a highly doped semiconductor wafer.

6. The device of claim 5, further comprising a source contact that covers a portion of the common substrate.

7. The device of claim 1, further comprising a first edge termination region disposed about the periphery of the first drain to mitigate premature voltage breakdown associated with the first transistor and a second edge termination region disposed about the periphery of the second drain to mitigate premature voltage breakdown associated with the second transistor.

8. The device of claim 7, further comprising a first electric stop field region disposed about the periphery of the first edge termination region to maximize voltage breakdown associated with the first transistor and a second electric stop field region disposed about the periphery of the second edge termination region to maximize voltage breakdown associated with the second transistor.

9. The device of claim 8, further comprising an isolation region disposed between the first drain and the second drain and which extends down to the substrate to electrically isolate the first transistor and second transistor from one another except through the common source.

10. The device of claim 7, wherein each of the first edge termination region and the second edge termination region comprise a plurality of guard ring pillars that facilitate the maximization of breakdown voltage for respective first and second transistors.

* * * * *